US009711089B2

(12) United States Patent
Sun

(10) Patent No.: US 9,711,089 B2
(45) Date of Patent: Jul. 18, 2017

(54) SCAN DRIVING CIRCUIT AND DISPLAY DEVICE

(71) Applicant: BOE Technology Group Co., Ltd., Beijing (CN)

(72) Inventor: Tuo Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/897,430

(22) PCT Filed: Apr. 16, 2015

(86) PCT No.: PCT/CN2015/076768
§ 371 (c)(1),
(2) Date: Dec. 10, 2015

(87) PCT Pub. No.: WO2016/095382
PCT Pub. Date: Jun. 23, 2016

(65) Prior Publication Data
US 2016/0372041 A1  Dec. 22, 2016

(30) Foreign Application Priority Data
Dec. 19, 2014  (CN) .......................... 2014 1 0806187

(51) Int. Cl.
*G09G 3/30* (2006.01)
*G09G 3/3258* (2016.01)
(Continued)

(52) U.S. Cl.
CPC ............. *G09G 3/3258* (2013.01); *G09G 3/20* (2013.01); *G09G 3/3266* (2013.01); *G11C 19/00* (2013.01);
(Continued)

(58) Field of Classification Search
CPC ......... G09G 2310/0286; G09G 3/3677; G09G 3/3648; G09G 3/3688; G09G 3/3266;
(Continued)

(56) References Cited

U.S. PATENT DOCUMENTS 6,891,916 B2 * 5/2005 Park ........................ G11C 19/28
345/100
8,040,315 B2 * 10/2011 Hirama ................ G09G 3/3677
345/100
(Continued)

FOREIGN PATENT DOCUMENTS

CN  1991943 A  7/2007
CN  104217764 A  12/2014
(Continued)

OTHER PUBLICATIONS

Sep. 6, 2015—International Search Report Appn PCT/CN2015/076768 with Eng Tran of Written Opinion.

*Primary Examiner* — Duc Dinh
(74) *Attorney, Agent, or Firm* — Banner & Witcoff, Ltd.

(57) ABSTRACT

A scan driving circuit, including a multi-stage shift register unit that outputs scan signals by stage under control of a clock signal (CKR, CKBR), the shift register unit includes an output terminal for outputting the scan signals, the scan driving circuit further includes a multi-stage signal generating unit, with an n-th stage signal generating unit is connected respectively to an output terminal of an n-th stage shift register unit and an output terminal of an (n+j)-th stage shift register unit, the n-th stage signal generating unit is configured to convert an outputted first level into a second level under triggering of a scan signal outputted by the n-th stage shift register unit, and convert an outputted second level into a first level under triggering of a scan signal outputted by the (n+j)-th stage shift register unit; the n and j both are positive integers.

13 Claims, 3 Drawing Sheets

(51) Int. Cl.
  *G09G 3/20* (2006.01)
  *G11C 19/00* (2006.01)
  *G09G 3/3266* (2016.01)
  *G11C 19/28* (2006.01)

(52) U.S. Cl.
  CPC ..... *G11C 19/28* (2013.01); *G09G 2310/0286* (2013.01); *G09G 2310/08* (2013.01)

(58) Field of Classification Search
  CPC ............ G09G 3/3696; G09G 2230/00; G09G 3/3659; G09G 3/3674; G09G 2310/0289; G09G 2310/0267; G09G 2310/0291; G09G 2310/0275; G09G 2310/08; G09G 2300/0408; G11C 19/28; G11C 19/285; G11C 19/36; G11C 19/00
  See application file for complete search history.

(56) References Cited

U.S. PATENT DOCUMENTS

| | | | |
|---|---|---|---|
| 2001/0011987 A1 | 8/2001 | Kubota et al. | |
| 2002/0044625 A1 | 4/2002 | Kim et al. | |
| 2011/0285752 A1 | 11/2011 | Park et al. | |
| 2012/0038609 A1* | 2/2012 | Chung | G09G 3/003 345/211 |

FOREIGN PATENT DOCUMENTS

| | | |
|---|---|---|
| CN | 104464595 A | 3/2015 |
| CN | 204288760 U | 4/2015 |

* cited by examiner

SCAN DRIVING CIRCUIT AND DISPLAY DEVICE

The application is a U.S. National Phase Entry of International Application No. PCT/CN2015/076768 filed on Apr. 16, 2015, designating the United States of America and claiming priority to Chinese Patent Application No. 201410806187.4 filed on Dec. 19, 2014. The present application claims priority to and the benefit of the above-identified applications and the above-identified applications are incorporated by reference herein in their entirety.

TECHNICAL FIELD

The present disclosure relates to a scan driving circuit and a display device.

BACKGROUND

A GOA (Gate driver on Array) circuit, or referred to as a scan driving circuit, in a common display device needs to simultaneously provide scan signals of multiple pulse waveforms, for example, each pixel in an AMOLED (Active Matrix/Organic Light Emitting Diode) display device needs to be driven by three scan signals Rn, Gn, En in common (where n represents a stage number or a pixel row number of a shift register unit). While, in order to simultaneously provide scan signals of different pulse waveforms to each row of pixels, a traditional approach uses a different clock signal line to control a different GOA circuit unit respectively, to thereby generate scan signals for each type of pulse waveform in a relatively independent way. But along an increased demand for high resolution and narrow border in the pertained art, as already known by the inventor, width of mutually independent clock signal lines (usually at least two groups of clock signal lines) has greatly affected reduction of wiring area associated.

SUMMARY

Embodiments of the present disclosure provide a scan driving circuit and a display device that can reduce wiring area of clock signal lines.

In a first aspect, at least one embodiment of the present disclosure provides a scan driving circuit comprising a multi-stage shift register unit that outputs scan signals by stage under control of a clock signal, the shift register unit includes an output terminal for outputting the scan signals, wherein the scan driving circuit further comprises a multi-stage signal generating unit, an n-th stage signal generating unit is connected respectively to an output terminal of an n-th stage shift register unit and an output terminal of an (n+j)-th stage shift register unit, the n-th stage signal generating unit is configured to convert an outputted first level into a second level under triggering of a scan signal outputted by the n-th stage shift register unit, and convert an outputted second level into a first level under triggering of a scan signal outputted by the (n+j)-th stage shift register unit; the n and j both are positive integers.

Optionally, the n-th stage signal generating unit includes an edge trigger that is effective at a rising edge or a falling edge.

Optionally, the n-th stage signal generating unit includes a first edge trigger and a second edge trigger; a trigger signal input terminal of the first edge trigger is connected to the output terminal of the n-th stage shift register unit; a trigger signal input terminal of the second edge trigger is connected to the output terminal of the (n+j)-th stage shift register unit.

Optionally, in the n-th stage signal generating unit, the first edge trigger is configured to connect the second level to the output terminal of the n-th stage signal generating unit when a rising edge or a falling edge of a trigger signal arrives, and the second edge trigger is configured to connect the second level to the output terminal of the n-th stage signal generating unit when a rising edge or a falling edge of a trigger signal arrives.

Optionally, the clock signal includes a first clock signal connected to a first clock signal line and a second clock signal connected to a second clock signal line, the first clock signal and the second clock signal have opposite phases.

Optionally, the n-th stage signal generating unit includes:

a first switching element with a control terminal thereof being connected to the second clock signal line, and a first terminal thereof being connected to the output terminal of the n-th stage shift register unit;

a second switching element with a control terminal thereof being connected to a second terminal of the first switching element, and a first terminal thereof being connected to a high level voltage line;

a third switching element with a control terminal thereof being connected to the output terminal of the (n+j)-th stage shift register unit, a first terminal thereof being connected to a second terminal of the second switching element, and a second terminal thereof being connected to a low level voltage line;

a fourth switching element with a control terminal thereof being connected to the second terminal of the second switching element, and a second terminal thereof being connected to the low level voltage line;

a fifth switching element with a control terminal thereof being connected to the second terminal of the first switching element, a first terminal thereof being connected to the high level voltage line, and a second terminal thereof being connected to a first terminal of the fourth switching element;

a first capacitor with a first terminal thereof being connected to the high level voltage line, and a second terminal thereof being connected to the second terminal of the first switching element;

a second capacitor with a first terminal thereof being connected to the second terminal of the fifth switching element, and a second terminal thereof being connected to the second terminal of the second switching element;

an output terminal for outputting the first level or the second level, and being connected to the second terminal of the fifth switching element.

Optionally, the shift register unit further includes an input terminal; in addition to that an input terminal of a first stage shift register unit is connected to an initial scan signal line, an input terminal of an arbitrary-stage shift register unit is connected to an output terminal of an adjacently upper-stage shift register unit.

Optionally, the n-th stage shift register unit includes:

a sixth switching element with a first terminal thereof being connected to the input terminal of the n-th stage shift register unit;

a seventh switching element with a control terminal thereof being connected to a second terminal of the sixth switching element;

an eighth switching element with a first terminal thereof being connected to a second terminal of the seventh switching element, and a second terminal thereof being connected to the low level voltage line;

a ninth switching element with a control terminal thereof being connected to the second terminal of the seventh switching element, and a first terminal being connected to the high level voltage line;

a tenth switching element with a control terminal thereof being connected to the second terminal of the sixth switching element, and a first terminal thereof being connected to a second terminal of the ninth switching element;

a third capacitor with a first terminal thereof being connected to the high level voltage line, and a second terminal thereof being connected to the second terminal of the seventh switching element;

a fourth capacitor with a first terminal thereof being connected to the second terminal of the ninth switching element, a second terminal thereof being connected to the second terminal of the sixth switching element;

the output terminal of the n-th stage shift register unit is connected to the second terminal of the ninth switching element;

between two shift register units of adjacent stages, in a shift register unit of one stage, the control terminal of the sixth switching element, the first terminal of the seventh switching element, and the control terminal of the eighth switching element are connected to the first clock signal line, the second terminal of the tenth switching element is connected to the second clock signal line; and in a shift register unit of the other stage, the control terminal of the sixth switching element, the first terminal of the seventh switching element, and the control terminal of the eighth switching element are connected to the second clock signal line, the second terminal of the tenth switching element is connected to the first clock signal line.

Optionally, the switching elements are thin film transistors.

In a second aspect, at least one embodiment of the present disclosure further provides a display device, comprising the scan driving circuit as described above.

Optionally, the display device is an organic light emitting diode display device.

It can be known from the above technical solutions that, the embodiments of the present disclosure, by setting the signal generating unit, take an n-th stage scan signal and an (n+j)-th scan signal as a trigger of scan signals of another pulse waveform, so that such scan signals cause a level conversion while triggering (such as converting from a low level to a high level or from a high level to a low level), thus a pulse width of the scan signals can be set by changing a numeric value of j. The embodiments of the present disclosure can obtain, based on one type of scan signals, another type of scan signals, that is, it achieves, with a scan driving circuit comprising one group of clock signal lines, functions achieved by a scan driving circuit that usually requires two groups of clock signal lines, wiring area is saved, amount of required logic elements is reduced, which facilitates improving resolution of the display device, enhancing yield, and reducing border width.

DETAILED DESCRIPTION OF THE EMBODIMENTS

Hereinafter, implementations of the present disclosure will be described in detail with reference to the accompanying drawings and the embodiments. The following embodiments serve to illustrate the present disclosure, but are not intended to limit the scope of the present disclosure.

Figure 1:
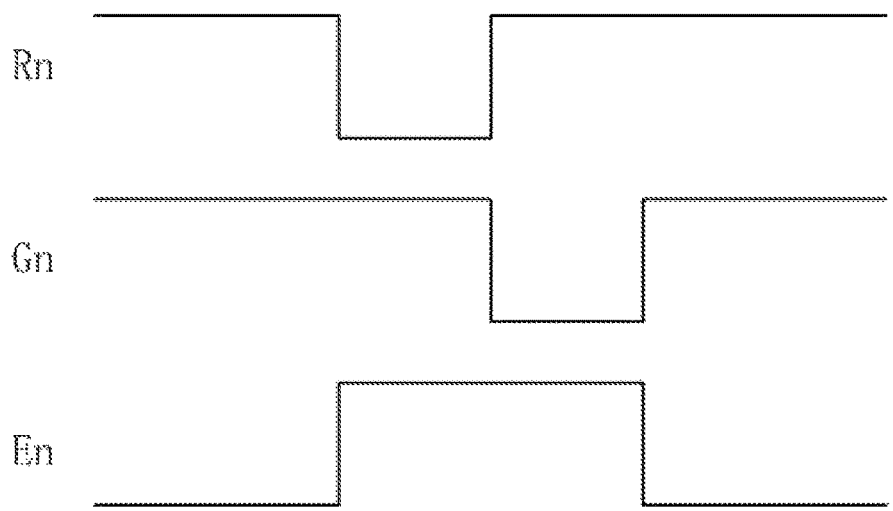
FIG. 1 is a timing diagram of three scan signals required to drive each pixel in an AMOLED display device.

Three types of scan signals shown in FIG. 1 usually require at least two different GOA circuit units (for example, Rn+1 is taken as Gn, and En is generated separately), so that only two groups of clock signal lines in the wiring area occupy nearly one-third of a full width, which greatly restricts reduction of the border width.

Figure 2:
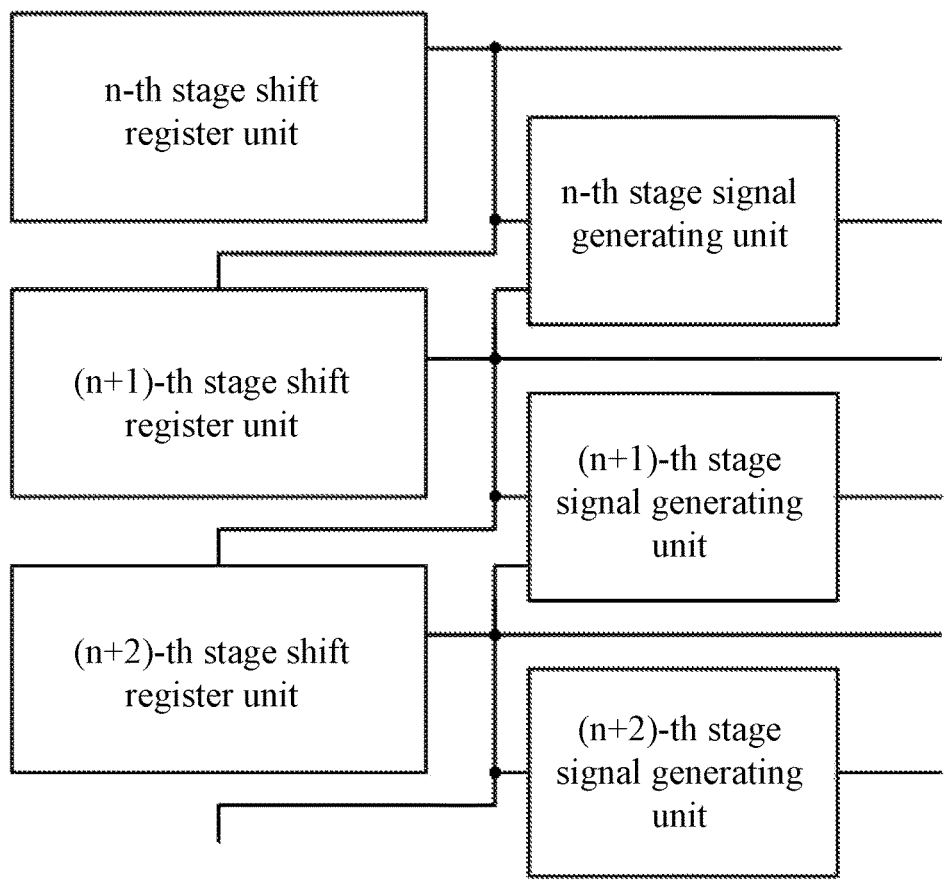
FIG. 2 is a structural block diagram of a scan driving circuit according to an embodiment of the present disclosure.

FIG. 2 illustrates a structural block diagram of a scan driving circuit according to an embodiment of the present disclosure, the scan driving circuit comprises a multi-stage shift register unit that outputs scan signals by stage under control of a clock signal, the shift register unit includes an input terminal (connected to a line at the upper side of the shift registers in FIG. 2) and an output terminal (connected to a line at the right side of the shift registers in FIG. 2) for outputting the scan signals. In FIG. 2, in addition to that an input terminal of a first stage shift register unit is connected to an initial scan signal line, an input terminal of an arbitrary-stage shift register unit is connected to an output terminal of an adjacently upper-stage shift register unit, so that the scan signals can, under control or triggering of the clock signals, be transferred sequentially by stage in the shift register unit of each stage, and outputted at the output terminal of the shift register unit of each stage. The shift register unit described above can be implemented by referring to circuit structure of the shift register in the prior art provided by the inventor. Of course, shift register units can also be cascaded in other ways, the present disclosure makes no limitations thereto.

The scan driving circuit further comprises a multi-stage signal generating unit, wherein an n-th stage signal generating unit is connected respectively to an output terminal of an n-th stage shift register unit and an output terminal of an (n+j)-th stage shift register unit, the n-th stage signal generating unit is configured to convert a first outputted level into a second level under triggering of a scan signal outputted by the n-th stage shift register unit, and convert an outputted second level into a first level under triggering of a scan signal outputted by the (n+j)-th stage shift register unit; the n and j both are positive integers. In FIG. 2, a connection manner between signal generating units is shown with j=1 as an example, of course, j may also be other positive integers.

It should be noted that a triggering manner for the above scan signals can be multiple, such as high level triggering, low level triggering, edge triggering that is effective at a rising edge or a falling edge, and so on. When a specific trigger condition is satisfied, the signal generating unit can convert an outputted first level into a second level or an outputted second level into a first level, wherein each of the first level and the second level may be one of a high level and a low level. Potentials of the high level and the low level discussed herein both are numeric values uniformly prescribed in an overall or partial digital logic unit, no more details repeated here. Thus it can be seen that, the above signal generating unit may be implemented by a digital logic unit or a combination thereof, and may also be implemented by a circuit with TFT (Thin Film Transistor) as basic elements.

It can be seen from the above technical solutions that, the embodiments of the present disclosure, by providing the signal generating unit, take an n-th stage scan signal and an (n+j)-th stage scan signal as a trigger of scan signals of another pulse waveform (i.e., the signals outputted by the signal generating unit), so that such scan signals cause a level conversion while triggering (such as converting from a low level to a high level or from a high level to a low level), thus a pulse width of the scan signals can be set by changing a numeric value of j. For example, if it is desired to obtain scan signals En from the scan signals Rn in FIG. 1, it only needs to convert En from a low level to a high level when Rn is converted from a high level to a low level, and convert En from a high level to a low level when Rn+2 is converted from a high level to a low level, i.e., the scan signals En can be generated by the n-th signal generating unit when j=2. And further, it can be seen that the triggering manner adopted in the above example is edge triggering that is effective at a falling edge, likewise, it is also possible to set the phase of the signals outputted by the above signal generating signal by changing this triggering manner into other triggering manners.

In other words, in the multi-stage signal generating unit in the above example, the n-th stage signal generating unit includes an edge trigger that is effective at a falling edge. The n-th stage signal generating unit described above includes a first edge trigger and a second edge trigger; a trigger signal input terminal of the first edge trigger is connected to the output terminal of the n-th stage shift register unit; a trigger signal input terminal of the second edge trigger is connected to the output terminal of the (n+2)-th stage shift register unit. In the n-th stage signal generating unit described above, the first edge trigger is configured to connect the high level to the output terminal of the n-th stage signal generating unit when a falling edge of a trigger signal arrives, and the second edge trigger is configured to connect the low level to the output terminal of the n-th stage signal generating unit when a falling edge of a trigger signal arrives. Thus it can be seen that, functions of the above signal generating unit can be achieved by adopting two edge triggers that are effective at a falling edge, of course, it is possible to, by referring to the above example, change the amount, connection relationship or structure of the edge triggers, so as to obtain better quality of outputted signals, this obviously is not departing from the spirit and scope of the present disclosure.

Also, it should be noted that, in the shift register units of the last few stages in the above scan driving circuit, the signal generating units may have a different connection manner or setting manner, and may also be replaced by other units with similar functions, it belongs to a special design for a rear portion of the scan driving circuit, those skilled in the art can make adaptive adjustment according to the embodiments provided by the present disclosure and making reference to the prior art provided by the inventor, which obviously is not departing from the spirit and scope of the present disclosure.

Accordingly, in comparison to the technical solution of generating scan signals of different pulse waveforms with independent GOA circuit units respectively, the embodiments of the present disclosure can obtain, based on one type of scan signals, another type of scan signals, that is, it achieves, with a scan driving circuit comprising one group of clock signal lines, functions achieved by a scan driving circuit that usually requires two groups of clock signal lines, wiring area is saved, amount of required logic elements is reduced, which facilitates improving resolution of the display device, enhancing yield, and reducing border width.

Circuit structure of a scan driving circuit is provided below, to further explain the technical solutions of the present disclosure.

Figure 3:
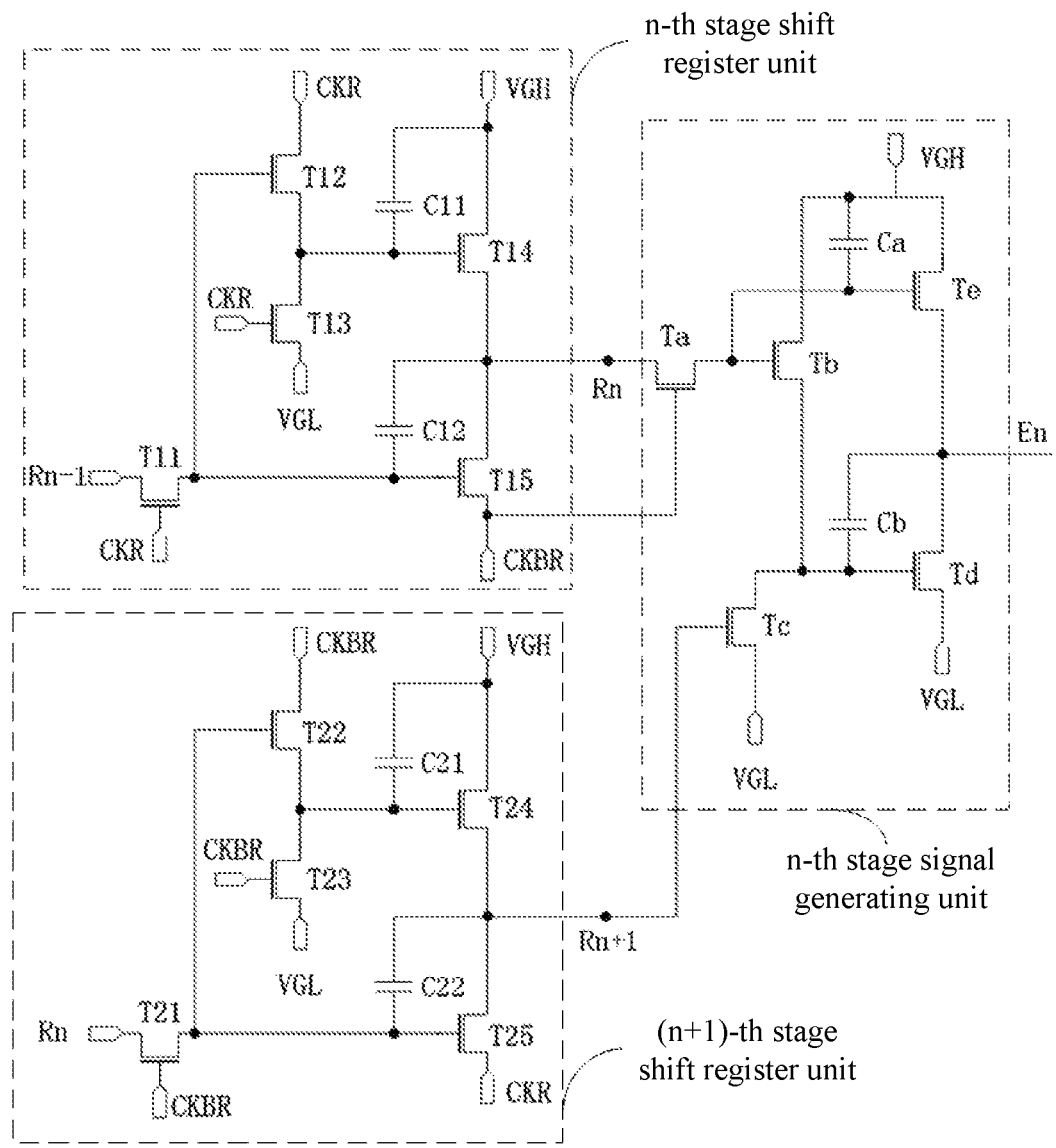
FIG. 3 is a partial circuit diagram of a scan driving circuit according to an embodiment of the present disclosure.

Referring to a partial circuit diagram of a scan driving circuit shown by FIG. 3, it shows only the n-th stage shift register unit, the (n+1)-th shift register unit, and the n-th stage signal generating unit, other parts of the scan driving circuit are structurally similar to this part of the circuit, and here example is provided also with j=1.

In addition, the clock signal includes a first clock signal CKR connected to a first clock signal line and a second clock signal CKRB connected to a second clock signal line, the first clock signal CKR and the second clock signal CKR have opposite phases, thus it can be seen that this scan driving circuit requires only a pair of clock signal lines.

The n-th stage signal generating unit described above includes:

a first switching element Ta with a control terminal thereof being connected to the second clock signal line (CKRB in FIG. 3), and a first terminal thereof being connected to the output terminal (Rn at the left side of Ta in FIG. 3) of the n-th stage shift register unit;

a second switching element Tb with a control terminal thereof being connected to a second terminal of the first switching element Ta, and a first terminal thereof being connected to a high level voltage line VGH;

a third switching element Tc with a control terminal thereof being connected to the output terminal (Rn+1 in FIG. 3) of the (n+1)-th stage shift register unit, a first terminal thereof being connected to a second terminal of the second switching element Tb, and a second terminal thereof being connected to a low level voltage line VGL;

a fourth switching element Td with a control terminal thereof being connected to the second terminal of the second switching element Tb, and a second terminal thereof being connected to the low level voltage line VGL;

a fifth switching element Te with a control terminal thereof being connected to the second terminal of the first switching element Ta, a first terminal thereof being connected to the high level voltage line VGH, and a second terminal thereof being connected to a first terminal of the fourth switching element Td;

a first capacitor Ca with a first terminal thereof being connected to the high level voltage line VGH, and a second terminal thereof being connected to the second terminal of the first switching element Ta;

a second capacitor Cb with a first terminal thereof being connected to the second terminal of the fifth switching element Te, and a second terminal thereof being connected to the second terminal of the second switching element Tb;

an output terminal for outputting the first level (which is a low level here) or the second level (which is a high level here), and being connected to the second terminal of the fifth switching element Te.

The n-th stage shift register unit described above includes:

a sixth switching element T11 with a first terminal thereof being connected to the input terminal (Rn−1 in FIG. 3) of the n-th stage shift register unit;

a seventh switching element T12 with a control terminal thereof being connected to a second terminal of the sixth switching element T11;

an eighth switching element T13 with a first terminal thereof being connected to a second terminal of the seventh switching element T12, and a second terminal thereof being connected to the low level voltage line VGL;

a ninth switching element T14 with a control terminal thereof being connected to the second terminal of the seventh switching element T12, and a first terminal being connected to the high level voltage line VGH;

a tenth switching element T15 with a control terminal thereof being connected to the second terminal of the sixth switching element T11, and a first terminal thereof being connected to a second terminal of the ninth switching element T14;

a third capacitor C11 with a first terminal thereof being connected to the high level voltage line VGH, and a second terminal thereof being connected to the second terminal of the seventh switching element T12;

a fourth capacitor C12 with a first terminal thereof being connected to the second terminal of the ninth switching element T14, a second terminal thereof being connected to the second terminal of the sixth switching element T11;

the output terminal (Rn at the left side in FIG. 3) of the n-th stage shift register unit is connected to the second terminal of the ninth switching element T14.

In FIG. 3, structure of the (n+1)-th stage shift register unit is the same as that of the n-th stage shift register unit (reference numerals are different), comprising: a sixth switching element T21, a seventh switching element T22, an eighth switching element T23, a ninth switching element T24, a tenth switching element T25, a third capacitor C21, a fourth capacitor C22, an input terminal (Rn at the left side of FIG. 3), and an output terminal (Rn+1 in FIG. 3).

In addition, between two shift register units of adjacent stages, in a shift register unit of one stage (such as the n-th stage shift register unit in FIG. 3), the control terminal of the sixth switching element T11, the first terminal of the seventh switching element T12, and the control terminal of the eighth switching element T13 are connected to the first clock signal line (CKR in FIG. 3), the second terminal of the tenth switching element T15 is connected to the second clock signal line (CKRB in FIG. 3); and in a shift register unit of the other stage (such as the shift register unit of the (n+1)-th stage), the control terminal of the sixth switching element T21, the first terminal of the seventh switching element T22, and the control terminal of the eighth switching element T23 are connected to the second clock signal line (CKRB in FIG. 3), the second terminal of the tenth switching element T25 is connected to the first clock signal line (CKR in FIG. 3).

The above switching elements are electronic devices that turn on or turn off an electrical connection between the first terminal and the second terminal under control of the control terminal (turning on or turning off can be defined by a magnitude of the current that passes through, and may also be defined in a variety of ways). In the embodiments of the present disclosure, the above switching elements are a P-channel thin film transistor (TFT), the first terminals of the switching elements are a source of the TFT, the second terminals of the switching elements are a drain of the TFT, and the control terminals thereof are a gate of the TFT.

Figure 4:
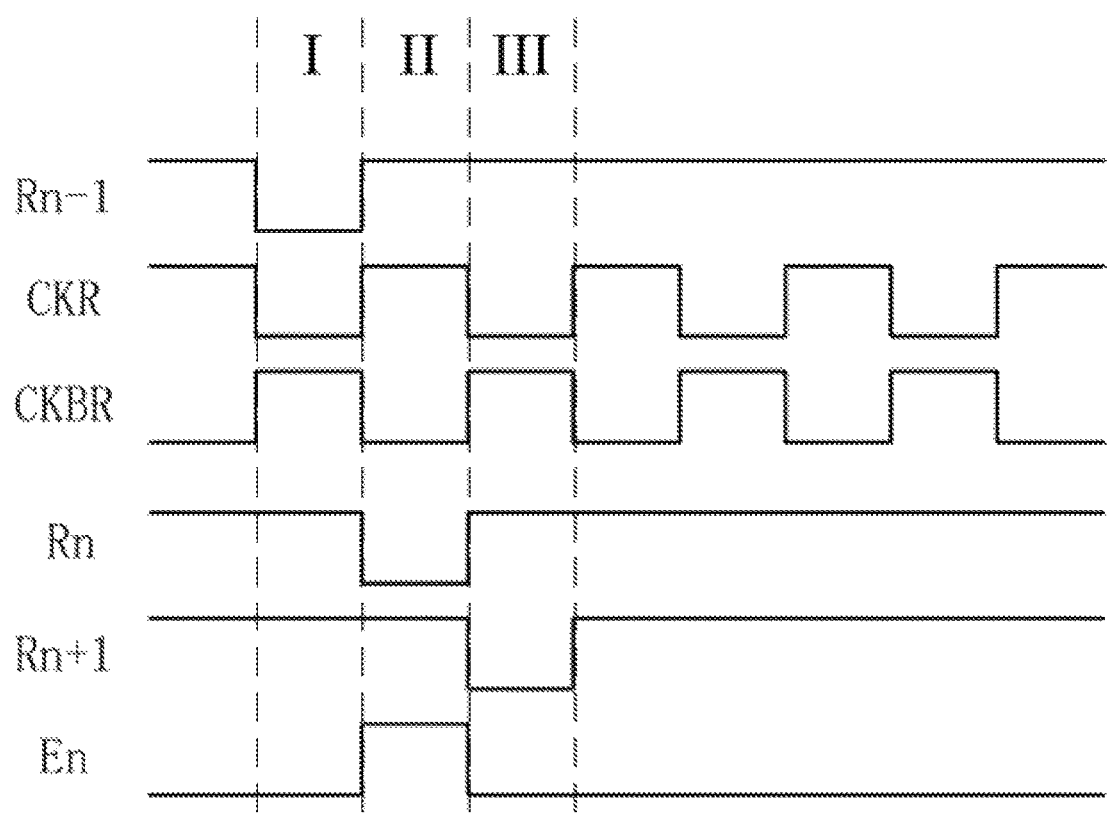
FIG. 4 is a circuit timing diagram of a scan driving circuit according to an embodiment of the present disclosure.

The circuit timing diagram of the above scan driving circuit is as shown in FIG. 4, in which:

With the n-th stage shift register unit as an example, in a phase I: the output signal Rn−1 of an adjacent previous stage shift register unit changes from a high level to a low level, meanwhile CKR is a low level and T11 and T13 are in a turned-on state, thus gate potentials of T12 and T15 are made low, so as to turn on T12 and T15; accordingly, a gate potential of T14 also is made low, a low potential is stored in C12, thus T14 is turned on, so that the output signal Rn of this stage is made a high potential. In a phase II, CKR changes into a high level, T11 and T13 are turned off, since the potential of C12 maintains, T12 and T15 maintain turned-on, a high potential is stored into C11, and C14 is turned off, so that the output signal Rn of this stage is made a low potential. In a phase III, CKR again turns back to a low level, T11 and T13 are turned on, because Rn−1 is a high level in this case, T12 and T15 are turned off, a low potential is stored into C11, thus a gate potential of T14 is made low, T14 is turned on, the output signal Rn of this stage is made a high potential. Thereby, under control (or driving, triggering) of the first clock signal CKR and the second clock signal CKRB, the multi-stage shift register unit will complete output of the scan signals progressively in accordance with the above process, as shown by Rn−1, Rn, and Rn+1 in FIG. 4.

In the n-th stage signal generating unit: when Rn is a low level, CKBR also is a low level, Rn+1 is a high level, thus Ta is turned on, Tc is turned off. In this case, a gate of Tb is a low level, Tb and Te are turned on, Td is turned off, En outputs a high level of VGH. When Rn and Rn+1 are both made a high level, due to the maintaining function of capacitors Ca and Cb, the output status of En will be maintained. When Rn+1 is made a low level, Ta and Tc are turned on, the gate of Tb is at a high potential, in this case, Td is turned on, Tb and Te are turned off, En outputs a low level of VGL. Thereby, the above structure effectuates an alternative configuration of two edge triggers that are effective at a falling edge, a pulse shape of En is as shown in FIG. 4.

In the embodiments of the present disclosure, the above one or more P-channel thin film transistors may be replaced with N-channel thin film transistors, in order to not change the functions of the above respective units, in this case, the following adaptive adjustment is needed: exchange the first terminal and the second terminal of the corresponding switching elements (and the source and drain wiring are interchanged), convert the high/low level of the specific signals, which is well known to those skilled in the art, details omitted.

Of course, it is also possible to adjust the pulse width of En by changing the numeric value of j, adjust the phase of En by changing the triggering manner, using shift register units or signal generating units having other structures, changing cascade relationship of the shift register units, changing connection relationship of partial shift register units and signal generating units, or designing a configuration that can replace the signal generating unit locally, and so on, only by using the above signal generating unit or an equivalent structure, it is possible to obtain, based on one type of scan signals, another type of scan signals, which obviously is not departing from the spirit and scope of the present disclosure.

The embodiments of the present disclosure also provide a display device, the display device comprises any of the scan driving circuit described above, the display device may be: a display panel, a mobile phone, a tablet computer, a television set, a display, a notebook computer, a digital picture frame, a navigator, and any other products or components having a display function. For example, the display device may be an organic light emitting diode display device, a pixel element in the OLED panel unit typically requires scan signals of multiple pulse forms to drive simultaneously, so it can uses any of the scan driving circuit described above to save wiring area, reduce amount of required logic elements, so as to improve resolution of the display device, enhance yield, and reduce border width.

In the description of the present disclosure, it should be noted that the orientation or position relationship indicated by the terms "above", "under" or the like is the orientation or position relationship shown based on the drawings, it is only intended to facilitate describing the present disclosure and simplifying the description, not to indicate or imply that a specified device or element must have a particular orientation, must be constructed or operated with a particular orientation, and therefore cannot be construed as limiting the present disclosure. Unless otherwise expressly specified and limited, the terms "install", "in communication", "connect" etc., shall be interpreted broadly unless other stated and defined expressly, for example, they can relate to fixed connection or removable connection or integral connection; or can be mechanical connection or electrical connection; or can be direct connection or indirect connection via an intermediate medium; or can relate to two elements connected internally thereto. Those of ordinary skill in the art can learn the particular meanings of the terms in the present disclosure dependent upon a practical scenario.

It should also be noted that, as used herein, relational terms such as first and second and the like are only used to distinguish one entity from another entity or one operation from another operation, but not necessarily require or imply that these entities or operations have any such actual relationship or order thereinbetween. In addition, the terms "comprise", "include" and any other variations thereof intend to cover nonexclusive inclusion so that the procedure, the method, the product or the equipment including a series of elements include not only these elements, but also other elements which are not listed explicitly, or also include inherent elements of these procedure, method, product or equipment. In the case that there is no further limitation, elements defined by the expressions "comprise one . . . " do not exclude there being additional identity elements in the procedure, method, product or equipment of the elements.

The above embodiments are only for illustrating the present disclosure, but not to limit the present disclosure, those of ordinary skill in the art can make various modifications and variants without departing from the spirit and scope of the present disclosure, thus all alternative technical solutions are also within the scope of the present disclosure, the patent protection scope of the present disclosure should be defined by the claims.

The present application claims priority to Chinese Patent Application No. 201410806187.4 filed on Dec. 19, 2014, the contents of which are hereby incorporated by reference in its entirety as part of the disclosure of the present application.

What is claimed is:

1. A scan driving circuit comprising multiple stages of shift register units that output scan signals by stages under control of a set of clock signals, the set of clock signals comprising a first clock signal connected to a first clock signal line and a second clock signal connected to a second clock signal line, each stage shift register unit including an output terminal for outputting a scan signal,
   wherein the scan driving circuit further comprises multiple stages of signal generating units,
   wherein a first input terminal and a second input terminal of an n-th stage signal generating unit are connected respectively to an output terminal of an n-th stage shift register unit and an output terminal of an (n+j)-th stage shift register unit, the n-th stage signal generating unit is configured to convert a level at an output terminal of the n-th stage signal generating unit from a first level to a second level under triggering of a scan signal outputted by the n-th stage shift register unit, and convert the level at the output terminal of the n-th stage signal generating unit from the second level to the first level under triggering of a scan signal outputted by the (n+j)-th stage shift register unit, both n and j being positive integers,
   wherein the n-th stage signal generating unit comprises:
       a first switching element having a control terminal connected to the second clock signal line, a first terminal as the first input terminal of the n-th stage signal generating unit, and a second terminal,
       a second switching element having a control terminal as the second input terminal of the n-th stage signal generating unit, a first terminal, and a second terminal connected to a first level voltage line,
       a third switching element having a control terminal connected to the second terminal of the first switching element, a first terminal connected to a second level voltage line, and a second terminal, and
       a fourth switching element having a control terminal connected to the first terminal of the second switching element, a first terminal, and a second terminal connected to the first level voltage line, and
   wherein the second terminal of the third switching element and the first terminal of the fourth switching element are connected in common and used as the output terminal of the n-th stage signal generating unit.

2. The scan driving circuit as claimed in claim 1, wherein the first clock signal and the second clock signal have opposite phases.

3. The scan driving circuit as claimed in claim 1, wherein the n-th stage signal generating unit further comprises:
   a fifth switching element having a control terminal connected to the second terminal of the first switching element, a first terminal connected to the second level voltage line, and a second terminal connected to the first terminal of the second switching element,
   a first capacitor having a first terminal connected to the second level voltage line, and a second terminal connected to the second terminal of the first switching element, and
   a second capacitor having a first terminal connected to the first terminal of the fourth switching element, and a second terminal connected to the second terminal of the fifth switching element.

4. The scan driving circuit as claimed in claim 1, wherein each stage shift register unit further comprises an input terminal, and
   in addition to that an input terminal of a first stage shift register unit is connected to an initial scan signal line, and an input terminal of an arbitrary-stage shift register unit is connected to an output terminal of an adjacently upper-stage shift register unit.

5. The scan driving circuit as claimed in claim 4, wherein the n-th stage shift register unit comprises:
   a sixth switching element with a first terminal thereof being connected to the input terminal of the n-th stage shift register unit;
   a seventh switching element with a control terminal thereof being connected to a second terminal of the sixth switching element;
   an eighth switching element with a first terminal thereof being connected to a second terminal of the seventh switching element, and a second terminal thereof being connected to the first level voltage line;
   a ninth switching element with a control terminal thereof being connected to the second terminal of the seventh switching element, and a first terminal being connected to the second level voltage line;

a tenth switching element with a control terminal thereof being connected to the second terminal of the sixth switching element, and a first terminal thereof being connected to a second terminal of the ninth switching element;

a third capacitor with a first terminal thereof being connected to the second level voltage line, and a second terminal thereof being connected to the second terminal of the seventh switching element; and a fourth capacitor with a first terminal thereof being connected to the second terminal of the ninth switching element, a second terminal thereof being connected to the second terminal of the sixth switching element, wherein the output terminal of the n-th stage shift register unit is connected to the second terminal of the ninth switching element, and between two shift register units of adjacent stages, in a shift register unit of one stage, the control terminal of the sixth switching element, the first terminal of the seventh switching element, and the control terminal of the eighth switching element are connected to the first clock signal line, the second terminal of the tenth switching element is connected to the second clock signal line; and in a shift register unit of the other stage, the control terminal of the sixth switching element, the first terminal of the seventh switching element, and the control terminal of the eighth switching element are connected to the second clock signal line, and the second terminal of the tenth switching element is connected to the first clock signal line.

6. The scan driving circuit as claimed in claim 5, wherein the first through tenth switching elements are thin film transistors.

7. A display device, comprising a scan driving circuit as claimed in claim 1.

8. The display device as claimed in claim 7, wherein the display device is an organic light emitting diode display device.

9. The display device as claimed in claim 7, wherein the first clock signal and the second clock signal have opposite phases.

10. The display device as claimed in claim 7, wherein the n-th stage signal generating unit further comprises:
a fifth switching element having a control terminal connected to the second terminal of the first switching element, a first terminal connected to the second level voltage line, and a second terminal connected to the first terminal of the second switching element,
a first capacitor having a first terminal connected to the second level voltage line, and a second terminal connected to the second terminal of the first switching element, and
a second capacitor having a first terminal connected to the first terminal of the fourth switching element, and a second terminal connected to the second terminal of the fifth switching element.

11. The display device as claimed in claim 7, wherein each stage shift register unit further comprises an input terminal; and
in addition to that an input terminal of a first stage shift register unit is connected to an initial scan signal line, and an input terminal of an arbitrary-stage shift register unit is connected to an output terminal of an adjacently upper-stage shift register unit.

12. The display device as claimed in claim 11, wherein the n-th stage shift register unit comprises:
a sixth switching element with a first terminal thereof being connected to the input terminal of the n-th stage shift register unit;
a seventh switching element with a control terminal thereof being connected to a second terminal of the sixth switching element;
an eighth switching element with a first terminal thereof being connected to a second terminal of the seventh switching element, and a second terminal thereof being connected to the first level voltage line;
a ninth switching element with a control terminal thereof being connected to the second terminal of the seventh switching element, and a first terminal being connected to the second level voltage line;
a tenth switching element with a control terminal thereof being connected to the second terminal of the sixth switching element, and a first terminal thereof being connected to a second terminal of the ninth switching element;
a third capacitor with a first terminal thereof being connected to the second level voltage line, and a second terminal thereof being connected to the second terminal of the seventh switching element; and
a fourth capacitor with a first terminal thereof being connected to the second terminal of the ninth switching element, a second terminal thereof being connected to the second terminal of the sixth switching element, wherein the output terminal of the n-th stage shift register unit is connected to the second terminal of the ninth switching element, and between two shift register units of adjacent stages, in a shift register unit of one stage, the control terminal of the sixth switching element, the first terminal of the seventh switching element, and the control terminal of the eighth switching element are connected to the first clock signal line, the second terminal of the tenth switching element is connected to the second clock signal line; and in a shift register unit of the other stage, the control terminal of the sixth switching element, the first terminal of the seventh switching element, and the control terminal of the eighth switching element are connected to the second clock signal line, and the second terminal of the tenth switching element is connected to the first clock signal line.

13. The display device as claimed in claim 12, wherein the first through tenth switching elements are thin film transistors.

* * * * *